United States Patent [19]
Skala et al.

[11] Patent Number: 6,020,647
[45] Date of Patent: Feb. 1, 2000

[54] COMPOSITE METALLIZATION STRUCTURES FOR IMPROVED POST BONDING RELIABILITY

[75] Inventors: Stephen L. Skala, Fremont; Subhas Bothra, San Jose; Dipu Pramanik, Saratoga; William Kuang-Hua Shu, Sunnyvale, all of Calif.

[73] Assignee: VLSI Technology, Inc., San Jose, Calif.

[21] Appl. No.: 09/215,902

[22] Filed: Dec. 18, 1998

[51] Int. Cl.$^7$ ..................................................... H01L 29/41
[52] U.S. Cl. ............................................. 257/784; 257/781
[58] Field of Search ...................................... 257/780, 781, 257/784

[56] References Cited

U.S. PATENT DOCUMENTS

| | | | |
|---|---|---|---|
| 5,036,383 | 7/1991 | Mori | 257/754 |
| 5,248,903 | 9/1993 | Heim | 257/781 |
| 5,502,337 | 3/1996 | Nozaki | 257/773 |
| 5,621,246 | 4/1997 | Motoyama | 257/736 |
| 5,736,791 | 4/1998 | Fujiki et al. | 257/781 |
| 5,739,587 | 4/1998 | Sato | 257/786 |
| 5,923,088 | 7/1999 | Shiue et al. | 257/781 |

OTHER PUBLICATIONS

Hu, Rodbell, Sullivan, Lee and Bouldin, "Electromigration and stress–induced voiding in fine Al and Al–alloy thin–film lines", vol. 39, No. 4, pp. 465–497, Jul. 1995, IBM J. Res. Develop.

S. Skala and S. Bothra, "Effects of W–Plug Via Arrangement on Electromigration Lifetime of Wide Line Interconnects", Feb. 1998 IEEE, ITC Tech. Conf., Jun. 1998, San Francisco, CA.

A. Blech, "Electromigration in thin aluminum films on titanium nitride", vol. 47, No. 4, Apr. 1976, American Inst. Of Physics, Journal of Applied Physics.

H.–U. Schreiber, "Electromigration Threshold in Aluminum Films", vol. 28, No. 6, pp. 617–626, 1985, Inst. Für Elektronik, West Germany.

*Primary Examiner*—David B. Hardy
*Attorney, Agent, or Firm*—Martine Penilla & Kim LLP

[57] ABSTRACT

Disclosed is a semiconductor chip and method for making a semiconductor chip having strategically placed composite metallization. The semiconductor chip includes a topmost metallization layer that defines a plurality of patterned features including a plurality of input/output metallization pads for receiving an associated plurality of gold bonding wires. An inter-metal oxide layer that is defined under the topmost metallization layer. The semiconductor chip further includes an underlying metallization layer that is defined under the inter-metal oxide layer in order to electrically isolate the topmost metallization layer from the underlying metallization layer. The underlying metallization has a plurality of patterned features, and portions of the plurality of patterned features lie at least partially in locations that are underlying the plurality of input/output metallization pads. The portions of the plurality of patterned features are composite metallization regions that have a plurality of deformation preventing oxide patterns that are resistant to compression force induced plastic deformation that occurs when the plurality of gold bonding wires are applied.

18 Claims, 8 Drawing Sheets

6,020,647

COMPOSITE METALLIZATION STRUCTURES FOR IMPROVED POST BONDING RELIABILITY

CROSS REFERENCE TO RELATED APPLICATIONS

This application is related to the following U.S. Patent Application entitled "Electromigration Impeding Composite Metallization Lines and Methods for Making the Same," having U.S. Application Ser. No. 09/215,099 (attorney docket no. VTI1P210), filed on the same day as the instant application. This application is hereby incorporated by reference.

BACKGROUND OF THE INVENTION

1. Field of the Invention

The present relates to the manufacture and packaging of semiconductor devices. More particularly, the present invention relates to techniques for improving the reliability of semiconductor devices by implementing metallization features that resist plastic deformation during wiring bonding operations.

2. Description of the Related Art

As is well known, semiconductor chips are made by fabricating active devices in a semiconductor substrate and then fabricating various interconnect layers to define the desired integrated circuit device. To facilitate discussion, FIG. 1A illustrates a top view of a semiconductor chip 10 having a core region 12 and a plurality of input/output (I/O) conductive pads 14 defined along the periphery. The I/O conductive pads 14 are generally interconnected to underlying metallization features through the use of conductive vias, which provide the electrical contact to the circuits of the semiconductor chip 10. Once the semiconductor chip 10 is placed into a package, the I/O conductive pads 14 are coupled to leads of the package using a wire bonding process.

FIG. 1B illustrates a partial cross-sectional view of the semiconductor chip 10 during a conventional gold wire bonding process. This conventional wire bonding process is currently being used for a majority of semiconductor circuits due to its ability to form strong bonds to the top layers of I/O metallization pads and its efficient use in applications where the I/O pads are relatively small. Although this conventional gold wire bonding process is preferred over others, it also presents several reliability problems. As shown in FIG. 1B, a capillary 16 (of a wire bonding apparatus) is used to apply a gold wire bond 18 to a top surface of a metal I/O conductive pad 14. In order to ensure that the bond is secure, the capillary applies a substantial force "F" over the I/O conductive pad 14 while implementing a sufficiently elevated temperature to cause the gold wire bond to soften and expand at edges 18'.

An unfortunate problem is that the pressure and temperature that is needed to ensure a secure wire bond may damage underlying metal and inter-metal oxides (IMOs). For instance, FIG. 1B shows how the force F and temperature (and often ultrasonic energy) exerted by the wire bonding process may cause an IMO 20 to exert a corresponding force onto an underlying metallization layer 22. Because IMO 20 is substantially more dense (i.e., harder) and less susceptible to plastic deformation as is aluminum-type metallizations, the metallization layer 22 (of underlying patterned features) lying under the IMO 20 absorbs the most plastic deformation. In this example, the force F is shown to compress the metallization layer 22 the most in the area directly under the wire bond, thus bring the thickness of the metallization layer 22 from X to $(X-\Delta X)$. In a location just outside of the wire bond, however, the metallization material is compressed to define a location in which the thickness of the metallization layer 22 grows from X to $(X+\Delta X)$.

Beyond the plastic deformation of the metallization layer 22, which may lie over an IMO 24, the more rigid IMO 20 may also suffer in that it develops cracks 20a at the edges due to the large shear stress absorbed by the IMO 20. These cracks 20a become very problematic when features not intended to be electrically connected to the wire bonded pad are routed in an underlying metallization layer. This is because the cracks 20a essentially form conductive leakage links (i.e., electrical shorts) that force an unwanted electrical interconnection, thereby destroying the intended circuitry and operation of a chip.

FIG. 1C illustrates a top view of the semiconductor chip 10, in which a staggered two row bond pad arrangement is used to increase the density and pitch of bond pads 14 along the periphery of the chip. Accordingly, a first row of bond pads 14a and 14b are show connected by conductive vias down to underlying metallization lines 22a and 22b which may be connected to the core 12 of the chip. A second row of bond pads 14c, 14d and 14e are integrally connected to metallization lines 14c', 14d'and 14e', respectively. In this illustration, a gold wire bond 18/18' is made to I/O pad 14c, which is at least partially defined over the metallization line 22a. As discussed above, the wire bonding process is known to cause cracks 20a as shown in FIG. 1D, wherein the cracks 20a are formed in the IMO 20 that is defined between metallization layers. These cracks 20a will therefore define an unwanted electrically conductive connection between metallization line 14c' and 22a, which can result in a complete failure of the integrated circuit device.

Due to this known problem, design rules have been defined such that designers are discouraged or prohibited from patterning metallization features under I/O pads that will be receiving gold wire bonds. Accordingly, any metallization defined under bond pads may only be passive in that there are no active transistors and any underlying metal is either isolated or electrically connected to only the I/O pad receiving the gold wire bond. This therefore places a constraint on the allowed wiring density which necessarily forces the design of larger chips taking up more silicon, which consequently drives up the cost of the device.

One way to reduce failures due to cracks 20a is to reduce the downward bonding force and bonding temperature. However, this solution has the downside of producing weak and less reliable wire bonding. Accordingly, this solution does not help the reliability of the chip.

In view of the foregoing, there is a need for metallization features that are less resistant to plastic deformation and methods for making the deformation resistant metallization features. In conjunction with the need for deformation resistant features is the need for preventing crack formation in IMO layers in order to circumvent inadvertent shorts between layers.

SUMMARY OF THE INVENTION

Broadly speaking, the present invention fills these needs by providing semiconductor integrated circuit chips having integral composite metallization in metallization regions that underlie input/output metallization pads in order to provide structural resistance to plastic deformation during wire bonding operations. It should be appreciated that the present invention can be implemented in numerous ways, including as a process, an apparatus, a system, a device, or a method. Several inventive embodiments of the present invention are described below.

In one embodiment, a semiconductor chip having strategically designed composite metallization and composed of a plurality of layers over a semiconductor substrate is disclosed. The semiconductor chip includes a topmost metallization layer defining a plurality of patterned features, some of which define a plurality of input/output metallization pads. An inter-metal oxide layer is defined under the topmost metallization layer. An underlying metallization layer is further defined under the inter-metal oxide layer in order to electrically isolate the topmost metallization layer from the underlying metallization layer. The underlying metallization defines a plurality of patterned features, and portions of the plurality of patterned features lie at least partially in locations that are underlying the plurality of input/output metallization pads. The portions of the plurality of patterned features are composite metallization regions which are configured to have a plurality of deformation preventing oxide patterns.

In another embodiment, a semiconductor chip having strategically designed composite metallization and which is attached to a semiconductor package is disclosed. The semiconductor chip includes a topmost metallization layer that defines a plurality of patterned features including a plurality of input/output metallization pads for receiving an associated plurality of gold bonding wires. An inter-metal oxide layer that is defined under the topmost metallization layer. The semiconductor chip further includes an underlying metallization layer that is defined under the inter-metal oxide layer in order to electrically isolate the topmost metallization layer from the underlying metallization layer. The underlying metallization has a plurality of patterned features, and portions of the plurality of patterned features lie at least partially in locations that are underlying the plurality of input/output metallization pads. The portions of the plurality of patterned features are composite metallization regions that have a plurality of deformation preventing oxide patterns that are resistant to compression force induced plastic deformation that occurs when the plurality of gold bonding wires are applied.

In yet another embodiment, a method for making an integrated circuit chip that is to be interconnected to a package via a plurality of bond wires is disclosed. The method includes: (a) identifying locations of input/output contact pads over the integrated circuit chip; (b) identifying locations of metallization features that at least partially underlie the locations of the input/output contact pads; and (c) designing a plurality of deformation preventing oxide patterns in the identified locations of the metallization features to define composite metallization regions that are substantially resistant to force induced plastic deformation.

As an advantage, because the composite metallization is strategically fabricated in locations underlying where I/O pads will later be fabricated, the danger of IMO layer cracking will be substantially eliminated. This therefore enables designers to more freely design any type of interconnect metallization lines under I/O pads, which in turn allows for the design of more densely integrated circuits which use up less silicon. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for semiconductor integrated circuit chips having composite metallization in metallization regions that underlie input/output metallization pads, which provide structural resistance to plastic deformation during wire bonding is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2A:
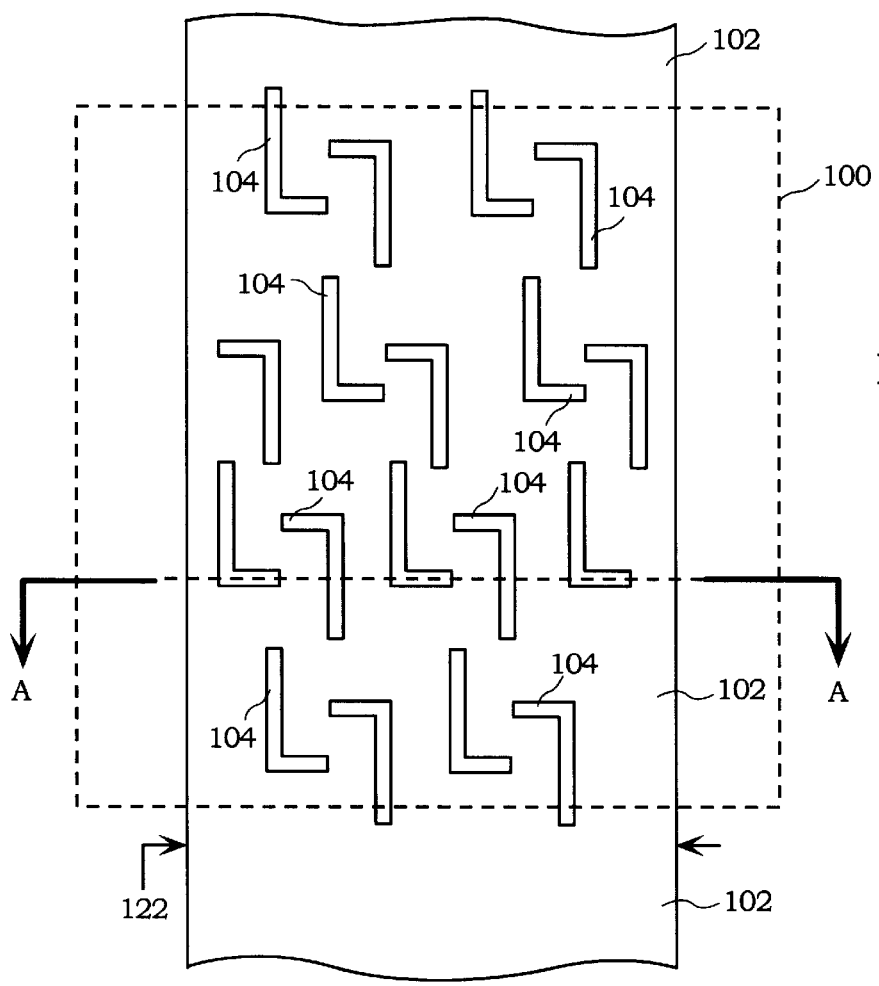
FIG. 2A illustrates a top view of a metallization feature that lies on a metal level below an input/output (I/O) pad, in accordance with one embodiment of the present invention.

FIG. 2A illustrates a top view of a metallization feature 102 that lies on a metal level below an input/output (I/O) pad 100, in accordance with one embodiment of the present invention. The metallization feature 102 is shown having a plurality of dielectric patterns 104 arranged in an opposing L pattern configuration. The exemplary opposing L pattern configuration is preferably arranged such that plastic deformation of the metallization feature 102 is substantially retarded when wire bonding is performed to attach a wire bond to the top surface of the I/O pad metallization 100.

In this embodiment, the opposing L patterns 104 are formed by first designing an etch mask that will enable the etching of feature patterns into the metallization feature 102 and then subsequently filling the etched patterns with a dielectric material. Generally, the dielectric material that fills that features 104 may be the same dielectric material used for the inter-metal oxide (IMO) 106 shown in FIG. 2B. Alternatively, the dielectric material used to fill the features 104 may be different than that of IMO 106, which would require a separate deposition operation to fill the etched features 104. For example, the dielectric material used to fill the features 104 may be selected from any number of deposited silicon dioxide ($SiO_2$) materials, or even spin-on glass (SOG).

The dielectric fill patterns 104 are preferably laid out in such a way that there is substantially no straight line path for the flow of metal atoms when the compressive hydrostatic stress produced by the wire bonding process is applied to the top surface of the metallization feature 102. Accordingly, the opposing L patterns are preferably designed to be fabricated into metallization feature 102 in regions that will be substantially underneath where I/O metallization pads 100 will ultimately be designed. As is well known, I/O pad metallization features 100 are typically designed around the periphery of a chip and also, sometimes designed over the top metallization level over the core region of the chip. In either situation, any metallization features, such as interconnect lines that are designed to lie underneath particular I/O metallization pads 100, will preferably be provided with the array of deformation preventing oxide patterns in order to retard any possible plastic deformation of the underlying metallization.

Figure 2B:
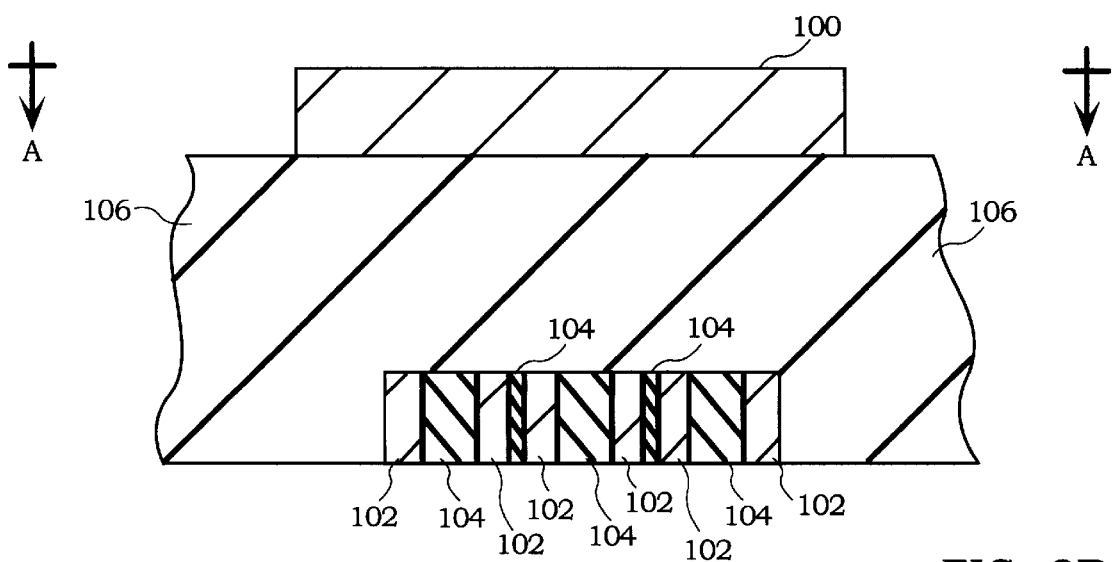
FIG. 2B shows a cross-sectional view A—A of a portion of the metallization feature of FIG. 2A, having a plurality of dielectric filled portions in accordance with one embodiment of the present invention.

As mentioned above, FIG. 2B shows a cross-sectional view A—A of a portion of the metallization feature 102 having a plurality of dielectric filled portions 104. This cross-sectional view therefore illustrates that the region of the metallization feature 102 lying underneath the location of an I/O metallization pad 100 which will have a composite metallization property (e.g., a metal region with integral oxide patterns). Also shown in FIG. 2B is the inter-metal oxide (IMO) 106, which is commonly formed at various levels of an integrated circuit device to insulate metallization layers. Although not shown, common CMOS chip structures will have more IMO layers and metal layers fabricated down to a substrate having transistor devices.

As mentioned above, the IMO 106 may define a separate oxide deposition than that used to fill the features 104 or, alternatively, be the same IMO dielectric material used to fill the etch patterns of the metallization feature 102. An important component is, however, that the composite metallization lie in a region that is substantially underneath the I/O metallization pad 100 in order to prevent the plastic deformation of the metallization feature 102, and thus prevent the cracking of the more brittle IMO layer 106.

Therefore, because the metallization feature 102 will be more resistant to the type of plastic deformation observed in prior art wire bonding techniques, metal features may now be readily routed underneath locations where I/O metallization pads 100 will ultimately lie without the danger of having short circuits created between the I/O metallization pad 100 and an underlying metallization feature which is not intended to make contact with the overlying I/O metallization pad 100. Therefore, the use of this composite metallization in metallization features lying underneath I/O metallization pads 100 will enable the design of more densely arranged integrated circuits and also, provide for more reliable circuitry that will not suffer from inadvertent short circuits due to IMO cracks.

In typical embodiments, the metallization features 102 that are routed throughout an integrated circuit to complete interconnections on various levels, are preferably designed to a particular width, depending upon the micron technology being implemented in a design. In a 0.2 μm technology design, the typical width 122 as shown in FIG. 2A of metallization feature 102, may be about 35 microns. The width 122 may, however, range in width between about 10 and about 100 microns.

Figure 2C:
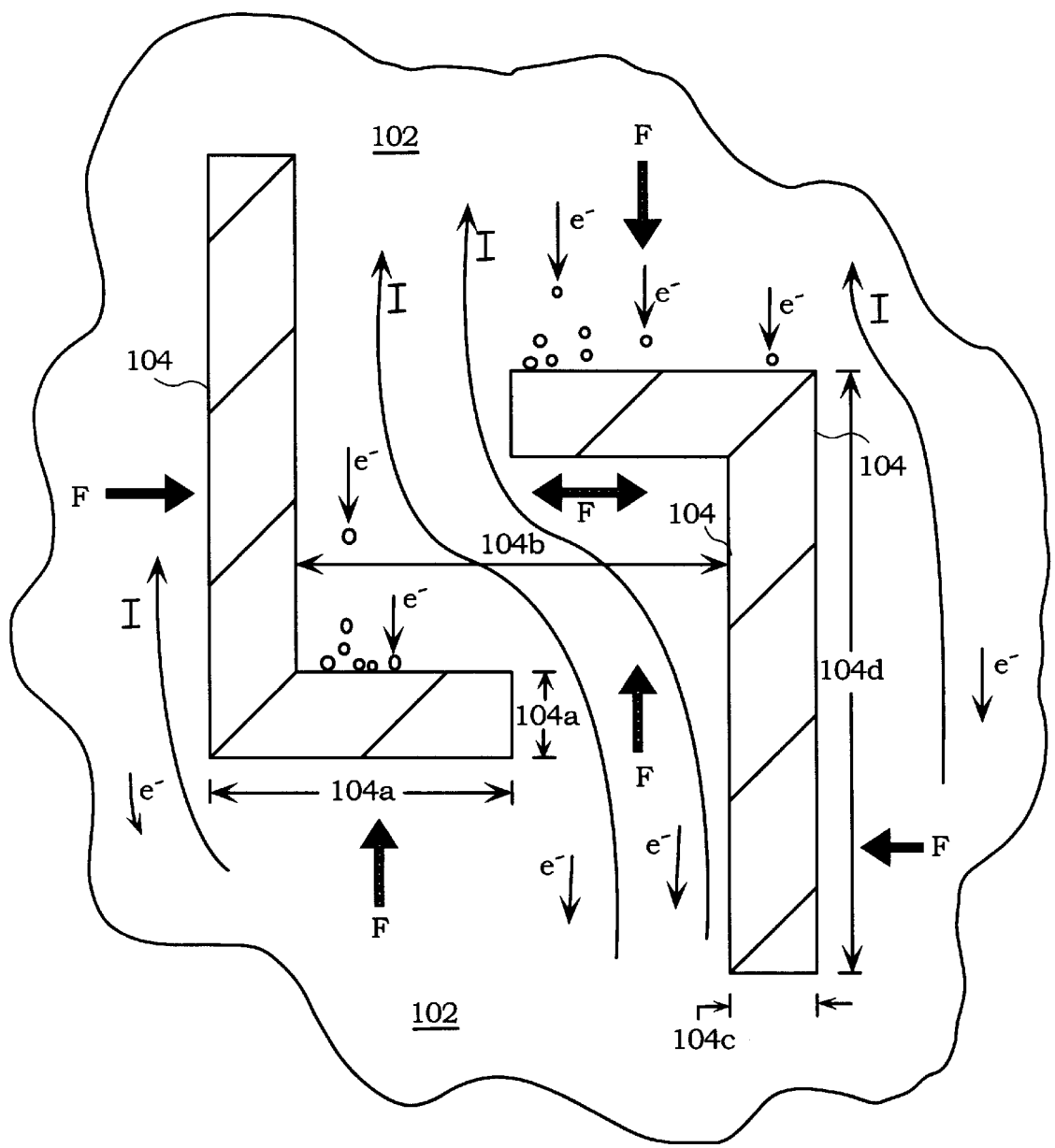
FIG. 2C illustrates a more detailed view of a pair of opposing L patterns in which exemplary dimensions are illustrated in accordance with one embodiment of the present invention.

FIG. 2C illustrates a more detailed view of a pair of opposing L patterns 104 in which exemplary dimensions are illustrated by dimensions 104a, 104b, 104c, and 104d. For example, dimension 104a may range between about 2 microns and about 50 microns, and more preferably, range between about 3 microns and about 10 microns, and most preferably, is about 5 microns. Dimension 104b preferably ranges between about 2 microns and about 50 microns, and more preferably, ranges between about 6 microns and about 20 microns, and is most preferably about 10 microns. Dimension 104c preferably ranges between about 0.2 micron and about 5 microns, and more preferably ranges between about 0.4 micron and about 1 micron, and most preferably is about 0.5 micron. Finally, dimension 104d ranges between about 5 microns and about 50 microns, and more preferably ranges between about 10 microns and 20 microns, and most preferably, is about 15 microns.

These optimal dimensions may vary, however, depending upon the width 122 of the metallization feature 102. This is because if the oxide patterns 104 take up too much area, the composite metallization region of the metallization feature 102 may become a region of excessive resistance. In a preferred embodiment, so long as a about 85 percent, at a given cross-section of the width 122 of the metallization feature 102, remains free of oxide pattern fill, the resistance of the composite metallization may not become a problem. However, the acceptable level of resistance along a composite metallization region will generally depend upon the design specifications of a given integrated circuit device being fabricated.

In view of these optimal geometric sizes for the opposing L patterns 104, the designer may implement a suitable number of opposing L patterns in an array format as shown in FIG. 2A to sufficiently prevent the plastic deformation during a wire bonding operation to an I/O metallization pad 100 as discussed above. FIG. 2C pictorially illustrates the lateral forces "F" that may occur during the wire bonding process. The opposing L patterns of this embodiment illustrate how any flow of metallization in any given direction will be substantially retarded due to the geometric arrangement of the oxide filled regions.

FIG. 2C also shows an added benefit of having the opposing L patterns in the composite metallization of the metallization feature 102. Specifically, when current "I" flows through the composite metallization of the metallization feature 102 in the illustrated direction, electrons ewill flow in the opposite direction carrying atoms of metallization. The electron flow therefore causes a flow of metallization atoms which are now prevented from electromigrating too much along the metallization feature 102.

This is particularly beneficial because interconnect metallization lines have a known problem of being susceptible to void creation when too many atoms electromigrate due to the electron flow in a particular direction. As a result, the oxide filled opposing L patterns 104 of the present invention will also advantageously assist in preventing voids from being formed in interconnect metallization lines.

Figure 3:
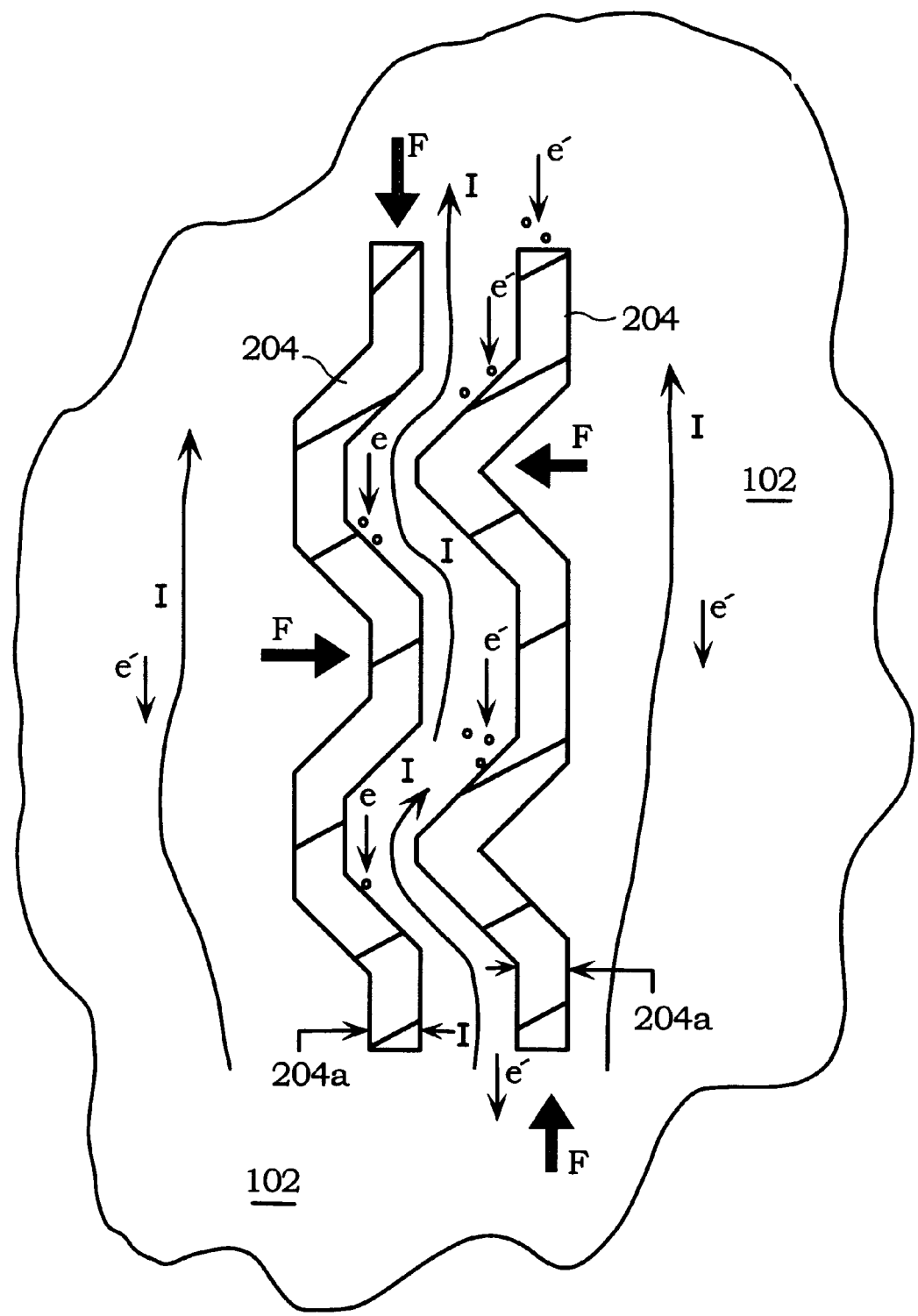
FIG. 3 illustrates another embodiment of dielectric features having complementary oxide zig-zag patterns in accordance with one embodiment of the present invention.

FIG. 3 illustrates another embodiment of dielectric features 204 (e.g., complementary zig-zag patterns) which may be patterned in regions of the metallization feature 102 in an array format such that plastic deformation of the metallization feature 102 is substantially retarded during wire bonding operations to the I/O metallization pad 100 as shown in FIG. 2A. In this embodiment, the dielectric features 204 are arranged in such a manner that a straight path is prevented from occurring between the dielectric features 204 in order to achieve the best plastic deformation prevention of the metallization feature 102.

In this embodiment, the dielectric features 204 preferably have a width 204a ranging between about 0.2 micron and about 5 about 0.4 micron and about 1 micron, and most preferably about 0.5 micron. The embodiment of FIG. 3 also has the advantage of substantially preventing plastic deformation due to lateral forces F and the advantage of substantially retarding any excessive electromigration flow of aluminum atoms when high currents are passed along the metallization feature 102, thus preventing the formation of voids in interconnect lines.

Figure 4:
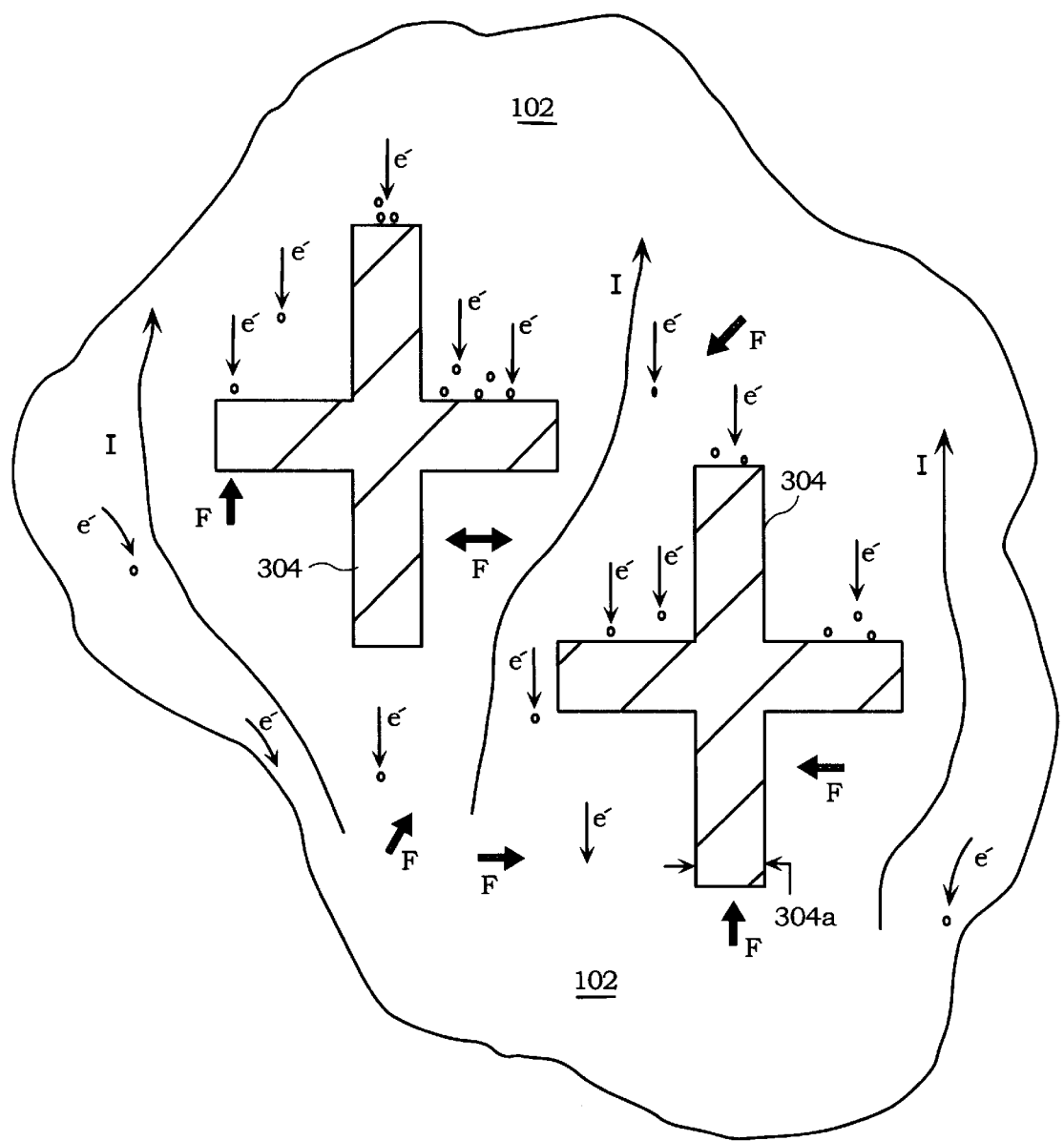
FIG. 4 illustrates another embodiment of the present invention in which complimentary cross "+" patterns are formed to make oxide features in regions of the metallization feature.

FIG. 4 illustrates another embodiment of the present invention in which complimentary cross "+" patterns are formed to make oxide features 304 in regions of the metallization feature 102, in accordance with one embodiment of the present invention. As in other embodiments of the present invention, the oxide features 304 are configured to prevent the plastic deformation of the metallization feature 102 during wire bonding operations as described above. In this example, the benefits of preventing excessive electromigration is also achieved because the aluminum atoms carried by the electron flow will be stopped at various regions of the oxide feature 304, thus preventing voids from forming in the interconnect metallization lines.

In summary, it is important to note that the exact geometric pattern implemented to create the composite metallization (i.e., metallization, including dielectric features patterned in an array format), is not necessarily critical, so long as the dielectric features prevent the plastic deformation of the metallization feature 102 under a location where I/O metallization pads 100 are ultimately designed to reside. Accordingly, any geometric pattern that achieves this result may also be implemented in accordance with alternatives of the exemplary composite metallization features described herein.

Figure 5:
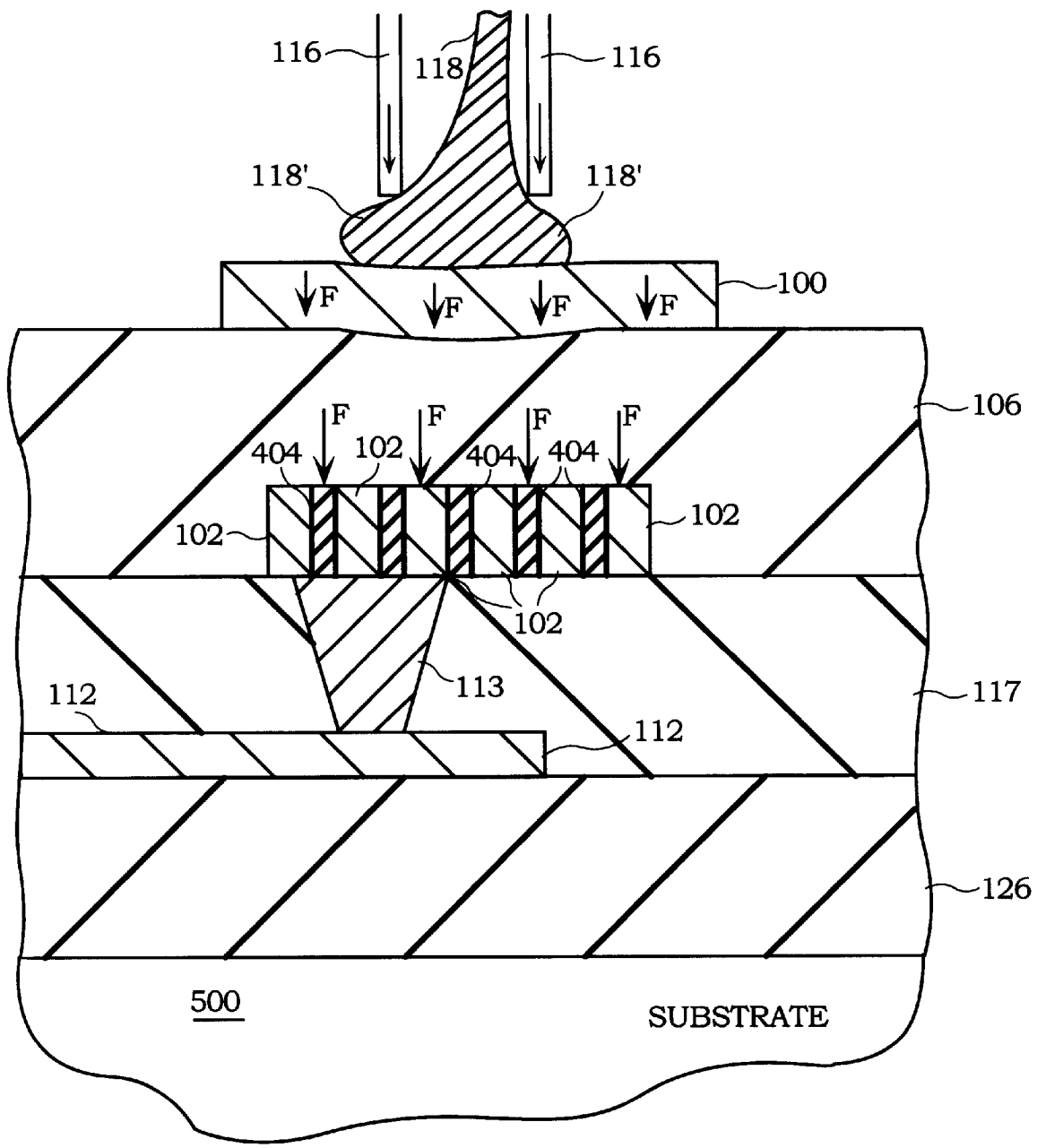
FIG. 5 illustrates a cross-sectional view of a semiconductor chip having a substrate 500 in accordance with one embodiment of the present invention.

FIG. 5 illustrates a cross-sectional view of a semiconductor chip having a substrate 500 in accordance with one embodiment of the present invention. In this example, an illustration is provided of the wire bonding operation implemented to apply a wire bond 118/118a using a capillary 116 to the top surface of an I/O metallization pad 100. As is a common requirement, the application of the wire bond to the I/O metallization pad 100 requires that a sufficient amount of force be applied as well as a suitably elevated temperature ranging between about 150° C. and about 300° C. to ensure that a secure wire bond has been established.

Figure 1A:
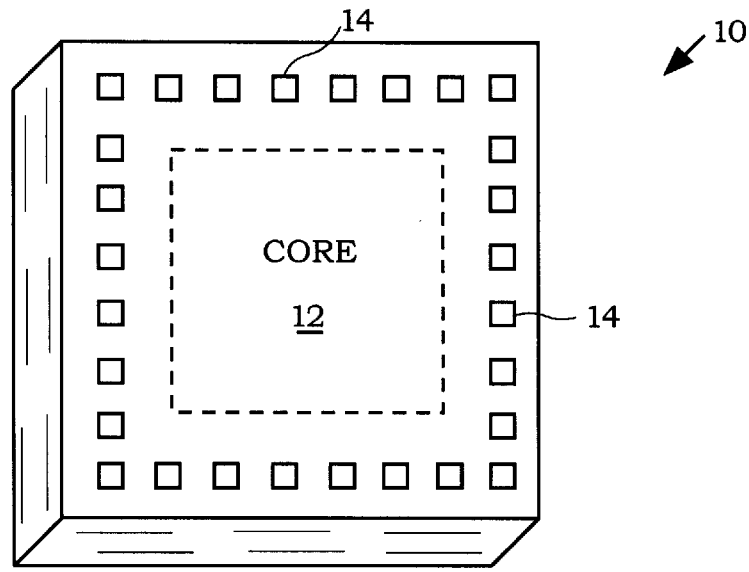
FIG. 1A illustrates a top view of a semiconductor chip having a core region and a plurality of input/output (I/O) conductive pads defined along the periphery.
Figure 1B:
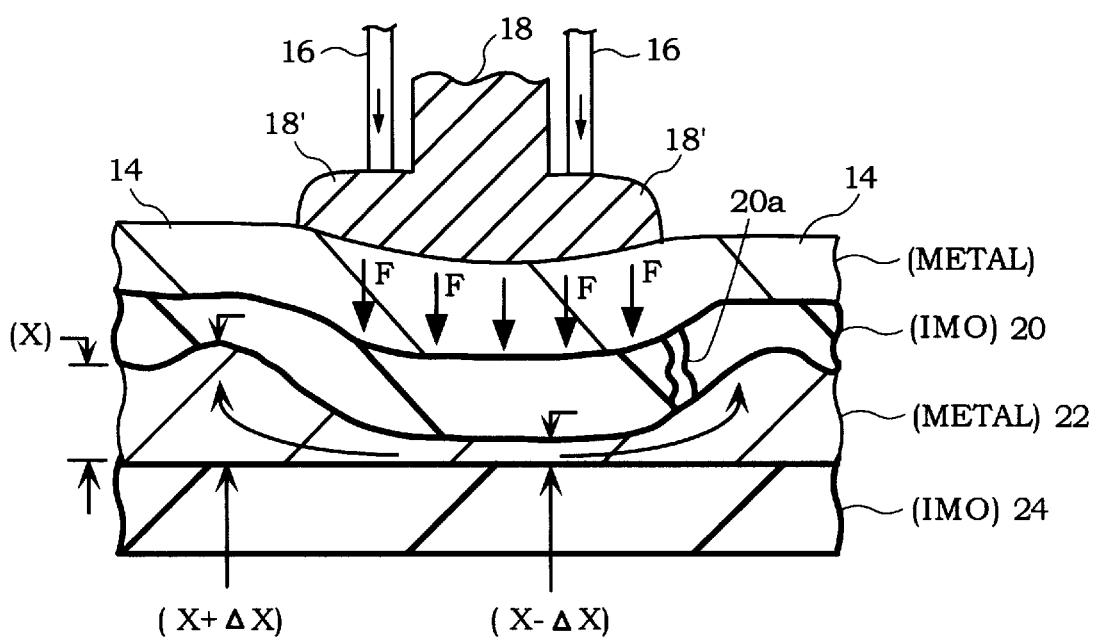
FIG. 1B illustrates a partial cross-sectional view of the semiconductor chip of FIG. 1A during a conventional gold wire bonding process.
Figure 1C:
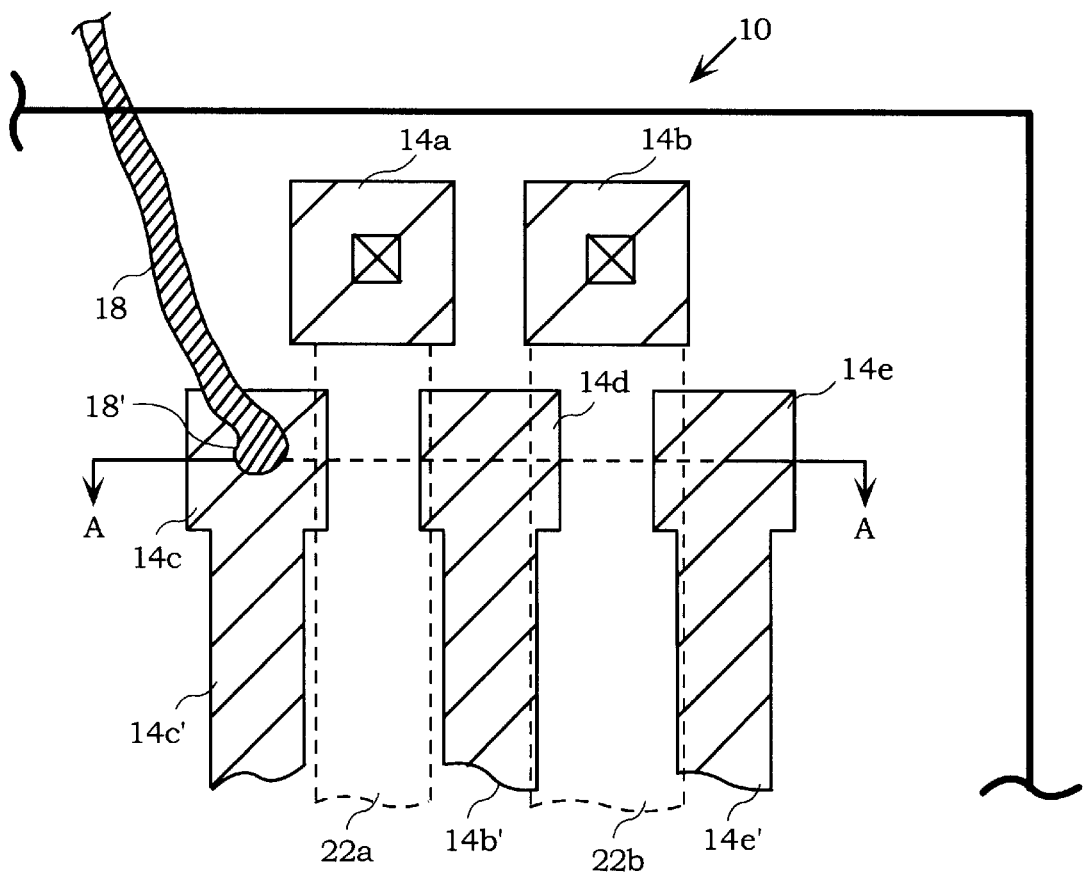
FIG. 1C illustrates a top view of the semiconductor chip, in which a staggered two row bond pad arrangement is used to increase the density and pitch of the bond pads along the periphery of the chip.
Figure 1D:
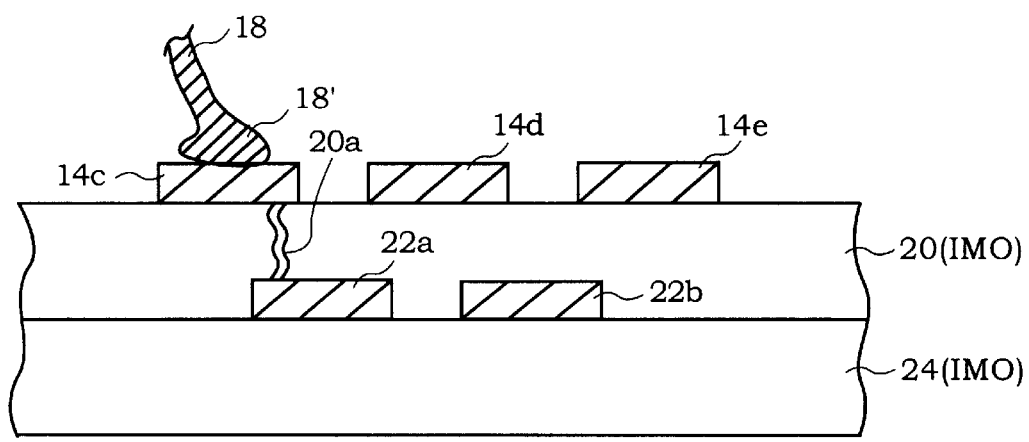
FIG. 1D illustrates a cross-sectional view of FIG. 1C.

In response to the application of the wire bond, the I/O metallization pad 100 will exert a compressive force "F" down upon the inter-metal oxide (IMO) 106 which in turn, exerts a compressive hydrostatic stress on the IMO 106 that is translated to the metallization feature 102. However, because the metallization feature 102 that lies underneath the I/O metallization pad 100 is in the form of a composite metallization having features such as those described above, the composite metallization structure will be more resistant to plastic deformation and therefore, hold its structure (i.e., as opposed to being deformed as shown in FIG. 1B).

Specifically, the composite metallization will include the metallization feature 102 having a plurality of oxide features 404 that will assist in providing a more rigid surface that is less susceptible to the plastic deformation. Because the composite metallization does not deform as does pure metallization, cracks in the IMO 106 will also be prevented. Because the IMO 106 cracks are no longer a threat to the reliability of the integrated circuit device, the metallization feature 102 may be routed underneath the I/O metallization pad 100 without the risk of creating an unwanted short between the I/O metallization pad 100 and an underlying metallization feature 102. As such, FIG. 5 illustrates the metallization feature 102 being routed underneath the I/O metallization pad 100 and connected through a conductive via 113 down to a metallization feature 112 that is insulated by an IMO 117. The metallization feature 112 is shown patterned over an IMO 126 which may be formed over the substrate 500. In some embodiments, the composite metallization may also be used in metal layers that are patterned in metal levels that are closer to the substrate.

Of course, semiconductor chips have several more IMO layers and several more metallization layers depending upon the complexity and routing requirements of an integrated circuit device. However, because routing may now be performed underneath locations where I/O metallization pads 100 will reside, a more densely integrated circuit device may be formed which may also allow the fabrication of smaller die sizes. Furthermore, the use of the composite metallization in metallization features routed substantially underneath the I/O metallization pad 100, also provides the benefit of routing features over the core region, as I/O pads are designed to lie substantially over the core region of an integrated circuit chip.

Figure 6:
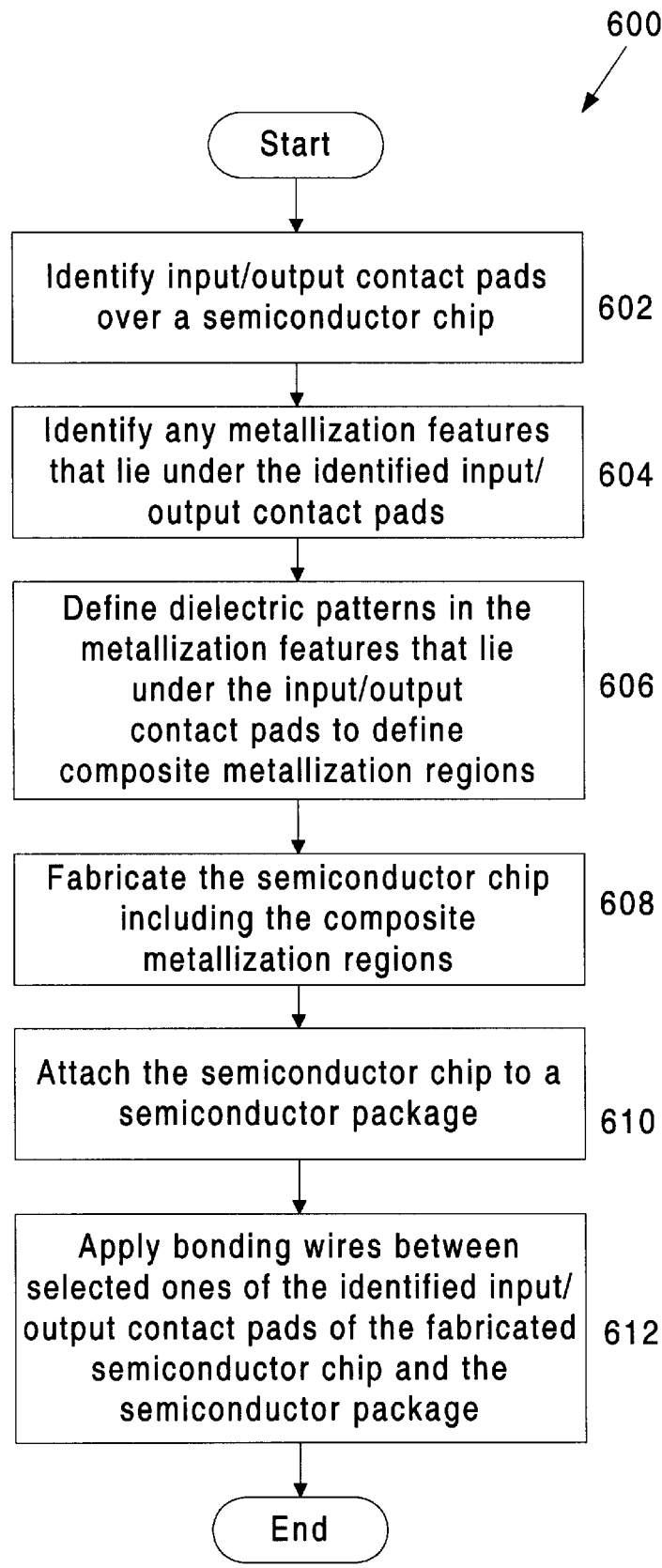
FIG. 6 illustrates a method in accordance with one embodiment of the present invention.

FIG. 6 illustrates a method 600 in accordance with one embodiment of the present invention. The method 600 begins at an operation 602 where input/output contact pads are identified over a semiconductor chip. For example, a design (e.g., a computer digital representation) of an integrated circuit chip will define where all of the input/output contact pads will ultimately be designed on the topmost metallization level of an integrated circuit chip. Once those I/O contact pads have been identified, the method will proceed to an operation 604. In operation 604, any metallization features that may lie at least partially under the identified input/output contact pads will be identified.

By doing this, those metallization feature regions which are at most risk to the plastic deformation that may occur during wire bonding, will be identified for processing in accordance with one embodiment of the present invention. Once those features have been identified, the method will proceed to an operation 606 where dielectric patterns are defined to be in the metallization features that lie under the input/output contact pads to define composite metallization regions. As mentioned above, the composite metallization regions may be composed of a plurality or an array of dielectric patterns having various geometric configurations.

By defining these geometric patterns in the metallization features that lie under or substantially under the input/output contact pads, the composite metallization regions will substantially prevent the deformation of those metallization regions. Once the composite metallization regions have been defined appropriately, the method will proceed to an operation 608 where the semiconductor chip is fabricated with the strategically placed composite metallization.

After the chip is fabricated from a wafer, the method proceeds to an operation 610 where the semiconductor chip is attached to a semiconductor package. For example, the package may be of any type, so long as it is configured to be wire bonded to I/O pads of the chip. The method now proceeds to an operation 612 where bond wires, such as gold bonds, are applied (using a capillary apparatus) between the chip and the package. Once the wire bonding has been completed without causing cracks in IMO layers and without causing plastic deformation of underlying metallization features, the method will end.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. In a semiconductor chip having a plurality of layers over a semiconductor substrate, comprising:
    a topmost metallization layer defining a plurality of patterned features including a plurality of input/output metallization pads;
    an inter-metal oxide layer being defined under the topmost metallization layer; and
    an underlying metallization layer being defined under the inter-metal oxide layer in order to electrically isolate the topmost metallization layer from the underlying metallization layer, the underlying metallization defines a plurality of patterned features and portions of the plurality of patterned features lie at least partially in locations that are underlying the plurality of input/output metallization pads, the portions of the plurality of patterned features are composite metallization regions;
    wherein the composite metallization regions have a plurality of deformation preventing oxide patterns.

2. The semiconductor chip as recited in claim 1, wherein the plurality of deformation preventing oxide patterns of the composite metallization regions are resistant to compression force induced plastic deformation.

3. The semiconductor chip as recited in claim 1, further comprising:
    a plurality of wire bonds being connected to a top surface of the plurality of input/output metallization pads, such that the top surface of the plurality of input/output metallization pads have a downward compression profile that extends into the inter-metal oxide and the portions of the plurality of patterned features that are composite metallization regions.

4. The semiconductor chip as recited in claim 3, wherein the plurality of deformation preventing oxide patterns of the composite metallization regions are resistant to compression force induced plastic deformation.

5. The semiconductor chip as recited in claim 3, wherein the downward compression profile is substantially retarded by the composite metallization regions.

6. The semiconductor chip as recited in claim 3, wherein the plurality of deformation preventing oxide patterns are selected from a group consisting of opposing-L patterns, complementary zig-zag patterns, and complementary cross patterns.

7. The semiconductor chip as recited in claim 3, wherein the plurality of wire bonds are gold wire bonds.

8. The semiconductor chip as recited in claim 1, wherein the plurality of patterned features have a width ranging between about 10 microns and about 100 microns.

9. The semiconductor chip as recited in claim 1, wherein the plurality of deformation preventing oxide patterns have elongated extensions that have widths ranging between about 0.2 micron and about 5 microns.

10. The semiconductor chip as recited in claim 9, wherein the plurality of deformation preventing oxide patterns have elongated extensions that have widths ranging between about 0.4 micron and about 1 micron.

11. A semiconductor chip being attached to a semiconductor package, the semiconductor chip having a plurality of layers, comprising:
    a topmost metallization layer defining a plurality of patterned features including a plurality of input/output metallization pads for receiving an associated plurality of gold bonding wires;
    an inter-metal oxide layer being defined under the topmost metallization layer; and
    an underlying metallization layer being defined under the inter-metal oxide layer in order to electrically isolate the topmost metallization layer from the underlying metallization layer, the underlying metallization has a plurality of patterned features and portions of the plurality of patterned features lie at least partially in locations that are underlying the plurality of input/output metallization pads, the portions of the plurality of patterned features are composite metallization regions that have a plurality of deformation preventing oxide patterns that are resistant to compression force induced plastic deformation that occurs when plurality of gold bonding wires are applied.

12. A semiconductor chip as recited in claim 11, wherein a top surface of each of the plurality of input/output metallization pads have a downward compression profile that extends into the inter-metal oxide and the portions of the plurality of patterned features that are composite metallization regions.

13. A semiconductor chip as recited in claim 12, wherein the portions of the plurality of patterned features that are composite metallization regions do not exhibit substantial lateral deforming flow in view of the downward compression profile.

14. A semiconductor chip as recited in claim 12, wherein the downward compression profile is substantially retarded by the composite metallization regions.

15. A semiconductor chip as recited in claim 12, wherein the plurality of deformation preventing oxide patterns are selected from a group consisting of opposing-L patterns, complementary zig-zag patterns, and complementary cross patterns.

16. A semiconductor chip as recited in claim 11, wherein the plurality of attended features have a width ranging between about 10 microns and about 100 microns.

17. A semiconductor chip as recited in claim 11, wherein the plurality of deformation preventing oxide patterns have elongated extensions that have widths ranging between about 0.2 micron and about 5 microns.

18. A semiconductor chip as recited in claim 15, wherein the plurality of deformation preventing oxide patterns have elongated extensions that have widths ranging between about 0.2 micron and about 5 microns.

* * * * *